(12) United States Patent
Coffy et al.

(10) Patent No.: US 12,713,964 B2
(45) Date of Patent: Aug. 18, 2026

(54) INTEGRATED CIRCUIT PACKAGE

(71) Applicant: STMicroelectronics (Grenoble 2) SAS, Grenoble (FR)

(72) Inventors: Romain Coffy, Voiron (FR); Younes Boutaleb, Grenoble (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 433 days.

(21) Appl. No.: 18/237,489

(22) Filed: Aug. 24, 2023

(65) Prior Publication Data

US 2024/0079363 A1 Mar. 7, 2024

(30) Foreign Application Priority Data

Sep. 1, 2022 (FR) ....................................... 2208802

(51) Int. Cl.
*H10W 74/10* (2026.01)
*H10W 72/00* (2026.01)
(Continued)

(52) U.S. Cl.
CPC ........ *H10W 74/114* (2026.01); *H10W 72/073* (2026.01); *H10W 76/138* (2026.01);
(Continued)

(58) Field of Classification Search
CPC ......... H01L 24/29; H01L 24/16; H01L 24/08; H01L 23/433; H01L 23/04; H01L 23/10; H01L 24/92; H01L 23/3121; H01L 24/83; H01L 24/81; H01L 23/051; H01L 24/13; H01L 23/42; H01L 24/32; H01L 23/367; H01L 24/73; H01L 23/053; H01L 2224/13147; H01L 2924/3512; H01L 2224/29155; H01L 2224/16237; H01L 2224/16227; H01L 2224/08225; H01L 2224/73253; H01L 2924/01327; H01L 2224/81901; H01L 2924/01022; H01L 2924/16251; H01L 2224/13005;
(Continued)

(56) References Cited

U.S. PATENT DOCUMENTS 5,098,305 A * 3/1992 Krajewski ................ H05K 3/36 29/830
5,381,316 A 1/1995 Hirai
(Continued)

OTHER PUBLICATIONS

INPI Search Report and Written Opinion for priority application, FR 2208802, report dated May 8, 2023, 11 pgs.

*Primary Examiner* — Mouloucoulaye Inoussa
(74) *Attorney, Agent, or Firm* — Crowe & Dunlevy LLC

(57) ABSTRACT

An integrated circuit package includes a support substrate and a cover fastened on a first face of the support substrate. The cover and support substrate define a housing containing an electronic integrated circuit chip having a first face equipped with electrically conductive protruding elements. A first space between the cover and a second face of the electronic integrated circuit chip is filled with a first shape memory material in the austenitic state. A second space between each pair of electrically conductive protruding elements and electrically conductive contact pads of the support substrate is filled with a second shape memory material in the austenitic state.

21 Claims, 2 Drawing Sheets

(51) Int. Cl.
*H10W 76/138* (2026.01)
*H10W 90/00* (2026.01)

(52) U.S. Cl.
CPC .... *H10W 72/07232* (2026.01); *H10W 74/142* (2026.01); *H10W 90/724* (2026.01); *H10W 90/794* (2026.01)

(58) Field of Classification Search
CPC . H01L 2224/92225; H01L 2224/29005; H01L 2224/83455; H01L 2924/01028; H01L 2924/35121; H01L 2224/32245; H01L 2224/83901; H01L 2924/18161; H01L 2224/13155; H01L 2924/3511; H01L 2224/13011; H01L 2224/81203; H01L 2224/81455; H01L 2224/13082; H01R 33/76; H01R 13/2421; H01R 24/50; G01R 1/0466; G01R 1/045; G01R 1/06722; G01R 31/26; G01R 1/0433; G01R 31/27; G01R 1/0416; G01R 31/2896; G01R 1/0408; H05K 7/1061; H05K 7/1007
See application file for complete search history.

(56) References Cited

U.S. PATENT DOCUMENTS 6,084,421 A * 7/2000 Swart .................. G01R 1/0483 324/762.02
6,489,790 B1 * 12/2002 An ......................... G01R 1/073 324/754.14
6,636,057 B1 * 10/2003 Uchikura ........... G01R 1/07371 324/756.05
8,269,516 B1 * 9/2012 Mardi ................ G01R 1/06722 324/754.08
2002/0055284 A1 * 5/2002 Ikeya ................... G01R 1/0483 439/67
2002/0056922 A1 * 5/2002 Funaya ................... H01L 24/13 438/117
2004/0166702 A1 * 8/2004 Higashi .................. H01R 13/33 439/66
2005/0245659 A1 * 11/2005 Chen ....................... H01L 23/42 524/439
2005/0255408 A1 * 11/2005 Grube ..................... H01L 24/80 430/311
2006/0211277 A1 * 9/2006 Soeta ................. G01R 31/2863 439/66
2006/0250149 A1 * 11/2006 Lan .................... G01R 1/07378 324/763.01
2007/0109000 A1 * 5/2007 Inoue ................... G01R 1/0483 324/762.02
2007/0170935 A1 * 7/2007 Huang .............. G01R 31/2889 324/756.07
2008/0020229 A1 * 1/2008 Taya ...................... C25D 3/562 419/2
2008/0094086 A1 * 4/2008 Kim ..................... G01R 1/0483 324/762.01
2008/0246500 A1 * 10/2008 Chong ................... G01R 1/073 324/755.05
2008/0315900 A1 * 12/2008 Ysaguirre ............ G01R 1/0433 324/756.02
2009/0023311 A1 * 1/2009 Goodman .......... H01R 13/2421 439/66
2009/0121735 A1 * 5/2009 Vaccani ............. G01R 31/2808 324/763.02
2009/0243640 A1 * 10/2009 Katsuma ............ G01R 1/06722 324/762.01
2010/0035444 A1 * 2/2010 Chiang ................ H05K 7/1069 439/66
2010/0327879 A1 * 12/2010 Yasuzawa .......... G01R 31/2889 324/537
2011/0279136 A1 * 11/2011 Shiozawa .......... G01R 31/2891 324/750.23
2012/0105089 A1 * 5/2012 Song ....................... H01L 22/32 324/755.05
2012/0244648 A1 * 9/2012 Matsuhashi .......... G01R 1/0466 257/E21.531
2013/0019996 A1 * 1/2013 Routledge .............. B23K 20/16 219/85.22
2018/0238957 A1 * 8/2018 Nakamura ............. H01R 33/76
2018/0275167 A1 * 9/2018 Nagata ............... H01R 12/7005
2019/0346482 A1 * 11/2019 Kiyokawa ............ G01R 1/0416
2022/0344853 A1 * 10/2022 Fukushima ........ H01R 12/7064
2024/0039185 A1 * 2/2024 Yu ........................ H01R 12/718
2025/0027988 A1 * 1/2025 Yamada ............. G01R 31/2875

* cited by examiner

INTEGRATED CIRCUIT PACKAGE

PRIORITY CLAIM

This application claims the priority benefit of French Application for Patent No. 2208802, filed on Sep. 1, 2022, the content of which is hereby incorporated by reference in its entirety to the maximum extent allowable by law.

TECHNICAL FIELD

Implementations and embodiments of the present invention relate to the field of microelectronics, in particular the field of packaging of integrated circuits, and more particularly the packages comprising integrated circuits with mounting of the "flip chip" type.

BACKGROUND

An electronic chip intended to be flip-mounted on one face, typically the upper face, of a carrier substrate, includes a front face equipped with protruding elements, typically electrically conductive bumps and a rear face which is opposite to the front face.

In the mounting of the "flip-chip" type, the bumps of the front face of the chip are soldered onto contact pads on the upper face of the carrier substrate.

The devices of the "Flip Chip" type with large-size chips are subject to damage due to the mechanical stresses caused during the manufacture of these devices. Indeed, due to the different thermal expansion coefficients between the chip and the carrier substrate, the manufacturing flow including heating/cooling steps creates known failures such as crazes, cracks, delaminations.

The existing solutions for preventing such failures are based on a specific set of materials (for example, use of a filler material known by the person skilled in the art under the name of "Underfill") or on laser-assisted bonding (LAB).

However, such options are expensive or not effective enough.

There is therefore a need to propose a more satisfactory solution for minimizing or even eliminating these failures during the manufacture of the packages including flip chips.

SUMMARY

According to one embodiment and implementation, it is proposed to insert a shape memory material, compressed in the martensitic state, advantageously thermally conductive, between the rear face of the chip and the package cover, then during of the manufacture of the package, to heat the package, for example to finalize the fastening of the cover on the support substrate, to a temperature which is higher than the temperature of end of transition to the austenitic state of the shape memory material, so that it expands to regain its initial shape so as to completely fill the space between the rear face of the chip and the cover and thus exert a pressure on the cover, which will create a spring effect and push the protruding elements (bumps) of the chip against the contact pads of the support substrate of the package.

Proper seamless electrical cooperation is therefore obtained between the bumps and the contact pads of the carrier substrate, even if the carrier substrate is deformed.

According to one aspect, an integrated circuit package is proposed, comprising a support substrate and a cover fastened on a first face, for example the upper face, of the support substrate and defining, with the support substrate, a housing containing at least one electronic chip having a first face, for example the front face, equipped with protruding elements, for example electrically conductive bumps, in seamless electrical cooperation with electrically conductive contact pads located on the first face of the support substrate.

Said at least one chip includes a second face, for example the rear face, opposite to the first face of the chip and defining, with the cover, a first space filled with a first shape memory material.

Such a package structure therefore allows having a chip which is not physically soldered onto the support substrate or mechanically attached to the cover (which allows a reduction in the stresses and deformations by mechanically releasing the structure). The electrical connections between the protruding elements (bumps) and the contact pads of the support substrate are maintained throughout the life of the component via this shape memory material which ensures a spring effect tending to push the chip towards the support substrate.

This first shape memory material is advantageously thermally conductive, which also allows maintaining a thermal connection between the chip and the cover throughout the life of the component.

The first face of the chip defines, with the first face of the carrier substrate, a second space advantageously devoid of filler material or adhesive material.

According to a particularly advantageous embodiment, the protruding elements are in electrical cooperation with said contact pads via a second electrically conductive shape memory material.

A spring effect is thus also obtained on the side of the protruding elements, which combined with the spring effect provided by the first shape memory material, further improves the good electrical conductivity between the protruding elements and the contact pads of the support substrate.

The first shape memory material and the second shape memory material are advantageously identical and may contain, for example, a nickel-titanium alloy ("Nitinol").

The first shape memory material and the second shape memory material contain a first amount of non-porous nickel-titanium alloy and a second amount of porous nickel-titanium alloy.

The presence of an amount of porous alloy allows increasing the elongation capacity of the shape memory material, which contributes to compensating for the movements of the carrier substrate and/or of the cover.

Thus, the second amount of porous alloy is for example less than or equal to 10% of the total amount of nickel-titanium alloy, which allows having an elongation capacity in the range of 10% which easily allows compensating for movements of the carrier substrate and/or of the cover, usually in the range of a few microns.

The porous nickel-titanium alloy, for example, has a modulus of elasticity comprised between 10 GPa and 100 GPa.

The first shape memory material and the second shape memory material also advantageously contain copper in an amount which is less than or equal to 5% of the total amount of the corresponding shape memory material.

The presence of copper is advantageous from the point of view of the mechanical behavior of the shape memory material since it allows, in small amounts, reinforcing the bidirectional effect of the shape memory material.

The first shape memory material has, for example, a temperature of end of transition to the austenitic state comprised between 40° C. and 100° C.

According to another aspect, a method for manufacturing an integrated circuit package is proposed, comprising the following steps: a) providing at least one electronic chip having a first face equipped with electrically conductive protruding elements; b) providing a support substrate having a first face equipped with electrically conductive contact pads; c) flipping the chip and causing the protruding elements to seamlessly electrically cooperate with the electrically conductive pads; d) providing a first layer of a first shape memory material in a martensitic state and having an initial thickness; e) deforming the first layer so as to give it a second thickness which is less than the initial thickness and depositing the first layer thus deformed on a second face of the flip chip which is opposite to the first face; f) fastening a cover on the first face of the support substrate so as to cover the first deformed layer, leaving a space between the first deformed layer and the cover; and g) completing the fastening of the cover on the support substrate by heating the structure obtained in step f) to a temperature which is higher than the temperature of end of transition to the austenitic state of the first shape memory material so that the first layer tends to regain its initial thickness and fills said space by ensuring a pressure on the cover.

The first shape memory material is advantageously thermally conductive.

According to an advantageous implementation, the method comprises between step b) and step c) a deposition, on the contact pads, of a layer of a second electrically conductive shape memory material identical to the first shape memory material deformed in the martensitic state, and step c) comprises flipping the chip and causing the protruding elements to seamlessly electrically cooperate with the electrically conductive pads via the layer of the second shape memory material, and in which in step g) the thickness of the layer of the second shape memory material increases so as to ensure a pressure on said protruding elements The first shape memory material contains, for example, a nickel-titanium alloy.

BRIEF DESCRIPTION OF THE DRAWINGS

Other advantages and features of the invention will appear on examining the detailed description of embodiments and implementations, without limitation, and the appended drawings in which.

DETAILED DESCRIPTION

Figure 1:
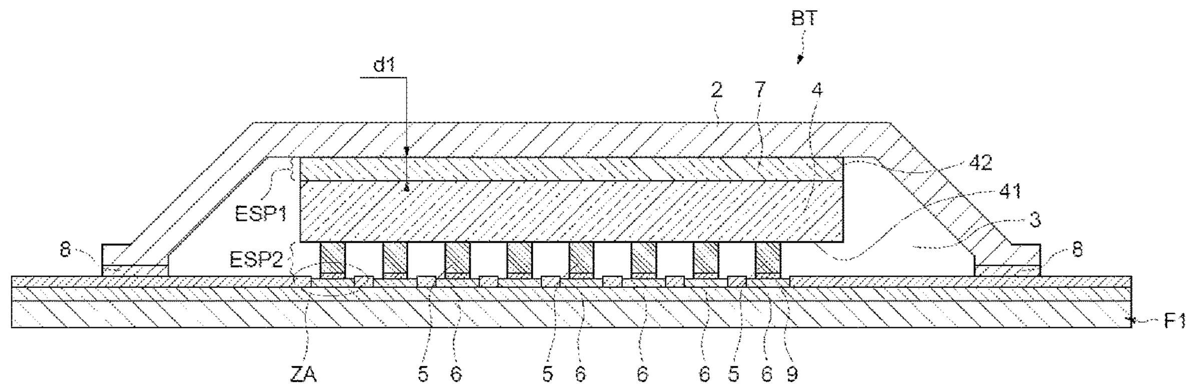
FIG. 1 shows a cross sectional view of an integrated circuit package.

In FIG. 1, the reference BT designates an integrated circuit package.

This package BT comprises a support substrate 1, of a structure which is conventional and known per se, including a first face F1, typically the upper face of the support substrate.

The lower face of the support substrate, opposite to the upper face F1, is generally provided with solder balls (not explicitly shown) intended to be soldered onto the tracks of a printed circuit board.

The package BT also includes a cover 2, also of a structure which is conventional and known per se.

This cover 2 is fastened on the first face F1 of the support by means, in particular, of an adhesive material 8 such as a glue.

The cover 2 defines, with the support substrate 1, a housing 3 containing at least one electronic integrated circuit chip 4.

The chip 4 includes a first face 41, typically the front face, equipped with electrically conductive protruding elements 5 such as bumps or pillars, for example made of copper.

The chip 4 also includes a second face 42, opposite to the first face 41, typically the rear face of the chip.

The chip 4 is mounted in a flip chip orientation, that is to say that the front face 41 faces the support substrate 1 while the rear face 42 faces the cover 2.

The rear face 42 of the chip 4 is located at a distance d1 from the cover 2 and defines therewith a first space ESP1 which is completely filled with a first shape memory material 7 shown in FIG. 1 in the austenitic state.

By way of non-limiting example, the first shape memory material 7 may contain a nickel-titanium alloy known to the person skilled in the art under the name "Nitinol", in which titanium and nickel are approximately present in the same percentages.

The chemical formula of Nitinol is, for example, $Ni_{14}Ti_{11}$. However, shape memory materials having other compositions may also be referred to in practice by the term "Nitinol".

A shape memory material is a material with a property which is well known to the person skilled in the art.

It is recalled that this shape memory property is defined as the ability of a sample of this material having undergone a significant deformation to recover its initial shape in the austenitic state by heating to a temperature which is higher than the temperature of end of transition to the austenitic state, a temperature known to the person skilled in the art under the expression "austenite finish".

Thus, the temperature of end of transition to the austenitic state of Nitinol is in the range of 50° C. to 100° C.

Nitinol is a shape memory material which is both thermally and electrically conductive.

Its thermally conductive nature allows it to contribute to the heat dissipation of the package.

As very schematically illustrated in FIG. 1, the package BT includes electrically conductive contact pads 6, distributed over the first face F1 of the carrier substrate.

And, the protruding elements 5 are in seamless electrical cooperation with these contact pads 6.

More specifically, in the embodiment of FIG. 1, distal ends of the protruding elements 5 are in contact with a second shape memory material 9, which, in the present case, is identical to the first shape memory material 7. In other words, the second shape memory material 9 also contains Nitinol.

And, as Nitinol is electrically conductive, the protruding elements 5, in contact with the Nitinol layer 9 which covers the upper surface of the corresponding contact pad 6, are indeed in electrical cooperation with these contact pads 6.

And this electrical cooperation is performed seamlessly.

Furthermore, as illustrated in FIG. 1, the first face 41 of the chip 4 defines, with the first face F1 of the carrier substrate, a second space ESP2 devoid of filler material ("underfill") or adhesive material such as a glue.

Figure 2:
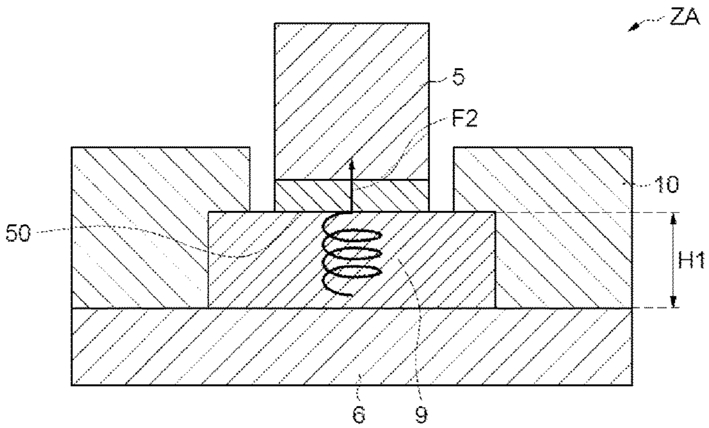
FIG. 2 shows in more detail a part of the integrated circuit package of FIG. 1.

Now, reference is made more particularly to FIG. 2 which schematically illustrates a zoom of the zone ZA of FIG. 1.

As shown in FIG. 2, the layer 9 of shape memory material is trapped in an insulating enclosure 10, known to the person skilled in the art by the name "Solder Mask".

The shape memory material 9 is herein also in its austenitic state and creates a spring effect exerting a thrust on the protruding element 5 in the direction of the arrow F2, in other words in the direction of the protruding elements 5.

Figure 3:
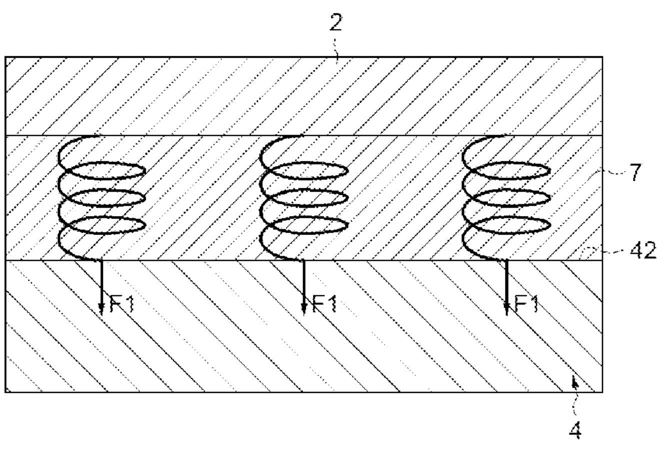
FIG. 3 shows in more detail a part of the integrated circuit package of FIG. 1.

In parallel, as schematically illustrated in FIG. 3, the shape memory material 7 located between the rear face 42 of the chip 4 and the cover 2 exerts a spring effect tending to push the chip 4 back in the direction of the arrow F1, in other words in the direction of the support substrate.

The combination of these two spring effects leads to a very good electrical contact between the distal end 50 of the protruding elements 5 and the layer 9 of the shape memory material and therefore a very good electrical cooperation between the protruding element 5 and the upper surface of the underlying corresponding contact pad 6, and this without the need to perform any soldering at the protruding elements.

Figure 4:
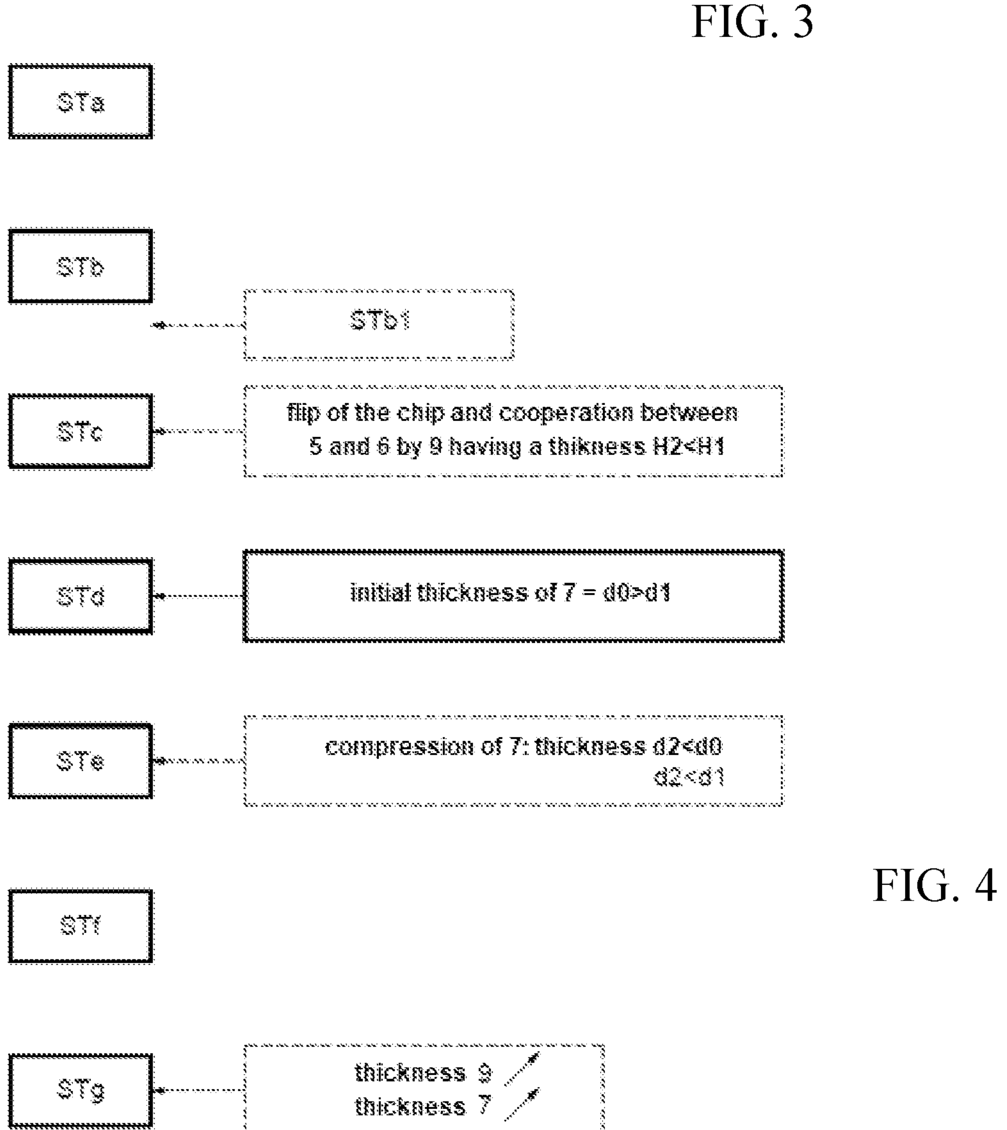
FIG. 4 shows steps in a method of manufacturing the integrated circuit package of FIG. 1.

Obtaining these spring effects will now be described with more particular reference to FIG. 4 which very schematically illustrates the steps of the method for manufacturing the package BT of FIG. 1.

In step STa, the electronic integrated circuit chip 4 is provided having the first face 41 thereof equipped with electrically conductive protruding elements 5.

In step STb, the support substrate 1 is provided having the first face F1 thereof equipped with electronically conductive contact pads 6.

Then, in step STc, the chip 4 is flipped to cause the protruding elements 5 to seamlessly electrically cooperate with the electrically conductive pads 6.

When it is also planned to use a shape memory material 9 on the side of the protruding elements, between step STb and step STc, is planned a step STb1 in which a layer of the shape memory material 9, which has been deformed in the martensitic state, is deposited in compression so as to have a height H2 which is less than the height H1 mentioned in FIG. 2.

And, in this case, in step STc, after flipping the chip, there is a seamless electrical cooperation of the protruding elements with the corresponding electrically conductive pads 6 via the layer of this shape memory material.

Then, in step STd, a first layer of the shape memory material 7 is provided having an initial thickness d0 which is greater than the distance d1 mentioned in FIG. 1.

Then, in step STe, this first layer is deformed in the martensitic state by compression, so as to give it a second thickness d2 which is less than the initial thickness d0, this second thickness d2 also being slightly less than the distance d1 mentioned in FIG. 1.

As an indication, for a given distance d1, a second thickness d2 will be selected, which is less than the distance d1, for example in the range of 1% to 5% less of the distance d1.

Then, the first layer thus deformed is deposited on the rear face 42 of the flip chip.

Then, in step STf, the cover 2 is fastened on the support substrate 1 via the glue 8 which is, for example, a pre-polymerized glue.

As the thickness of the shape memory material layer 7 is slightly less than the distance d1 between the rear face of the chip and the cover 2, a space thus remains between this layer 7 and the cover which allows its fastening on the support substrate while covering the chip.

Finally, the fastening of the cover on the support substrate is completed in step STg by heating the structure obtained in step STf to a temperature which is higher than the temperature of end of transition to the austenitic state of the shape memory material. This heating allows, on the one hand, completely polymerizing the glue 8 and, on the other hand, causing the shape memory material to pass into its austenitic state so that it regains its initial shape, in this case so that the material layer 7 increases in thickness to tend to regain its initial thickness which is greater than the distance d1.

As a result, the space ESP1 is completely filled by the shape memory material 7 and it ensures its spring effect as schematically illustrated in FIG. 3.

When the shape memory material layer 9 has also been deposited in the enclosure 10, the heating to the temperature which is higher than the temperature of end of transition to the austenitic state leads to an increase in the thickness of the layer 9 which causes the spring effect illustrated in FIG. 2.

As an indication, in step STG, the package will be heated to a temperature in the range of a hundred degrees, depending on the used materials.

The package according to these embodiments and implementations therefore uses a shape memory material, for example nitinol, acting as a spring allowing a proper electrical cooperation between the protruding elements 5 and the underlying contact pads of the support substrate, and this seamlessly, and even in the case of warping of the support substrate.

There is no soldering at the protruding elements 5 and consequently no stress transmitted to the chip.

There is no filler material in the structure and no stress appearing during the life of the product.

The invention is not limited to the implementations and embodiments which have just been described, but encompasses all variants thereof.

Thus, it is possible to use for the shape memory materials 7 and 9, non-porous Nitinol and porous Nitinol, which allows increasing the elongation capacity of the shape memory material.

It is also possible that the shape memory material also contains copper in an amount which is less than or equal to 5% of the total amount of the corresponding shape memory material.

Indeed, the presence of copper in small amounts allows reinforcing the bidirectional effect of the shape memory material.

The invention claimed is:

1. An integrated circuit package, comprising:

a support substrate including a first face with electrically conductive contact pads and an insulating layer over the first face of the support substrate and including an opening extending through the insulating layer at each electrically conductive contact pad;

a cover fastened on a first face of the support substrate and defining, with the support substrate, a housing;

at least one electronic integrated circuit chip contained within the housing;

wherein the at least one electronic integrated circuit chip has a first face equipped with electrically conductive protruding elements and a second face opposite to the first face; and a layer of a first shape memory material located within each opening of the insulating layer and in contact with the electrically conductive contact pad;

wherein each electrically conductive protruding element of the at least one electronic integrated circuit chip extends into the opening of the insulating layer to make contact with the layer of the first shape memory material; and wherein the electrically conductive protruding elements are in electrical cooperation with the electrically conductive contact pads of the support substrate via the layers of the first shape memory material.

2. The package according to claim 1, wherein the first shape memory material is thermally conductive.

3. The package according to claim 1, wherein a space between the first face of the at least one electronic integrated circuit chip and the first face of the support substrate is devoid of filler material.

4. The package according to claim 1, wherein a space between the first face of the at least one electronic integrated circuit chip and the first face of the support substrate is devoid of adhesive material.

5. The package according to claim 1, wherein the first shape memory material has a temperature of end of transition to an austenitic state comprised between 40° C. and 100° C.

6. The package according to claim 1, wherein the first shape memory material contains a nickel-titanium alloy.

7. The package according to claim 6, wherein the first shape memory material contains a first amount of non-porous nickel-titanium alloy and a second amount of porous nickel-titanium alloy.

8. The package according to claim 7, wherein the second amount is less than or equal to 10% of the total amount of nickel-titanium alloy.

9. The package according to claim 7, wherein the porous nickel-titanium alloy has a modulus of elasticity comprised between 10 GPa and 100 GPa.

10. The package according to claim 6, wherein the first shape memory material contains copper in an amount which is less than or equal to 5% of a total amount of the first shape memory material.

11. The package according to claim 1, wherein a space between the second face of the at least one electronic integrated circuit chip and the cover is filled with a second shape memory material.

12. The package according to claim 11, wherein the second shape memory material is thermally conductive.

13. The package according to claim 12, wherein the first shape memory material and the second shape memory material are identical.

14. The package according to claim 11, wherein the first shape memory material and the second shape memory material each contain a nickel-titanium alloy.

15. The package according to claim 14, wherein the first shape memory material and the second shape memory material each contain a first amount of non-porous nickel-titanium alloy and a second amount of porous nickel-titanium alloy.

16. The package according to claim 15, wherein the second amount is less than or equal to 10% of the total amount of nickel-titanium alloy.

17. The package according to claim 15, wherein the porous nickel-titanium alloy has a modulus of elasticity comprised between 10 GPa and 100 GPa.

18. The package according to claim 11, wherein the first shape memory material and the second shape memory material each also contain copper in an amount which is less than or equal to 5% of a total amount of the corresponding shape memory material.

19. A method for manufacturing an integrated circuit package, comprising:

a) providing at least one electronic integrated circuit chip having a first face equipped with electrically conductive protruding elements;

b) providing a support substrate having a first face equipped with electrically conductive contact pads and an insulating layer over the first face of the support substrate and including an opening extending through the insulating layer at each electrically conductive contact pad;

c) providing within each opening of the insulating layer and in contact with the electrically conductive contact pad a first layer of a first shape memory material in a martensitic state and having an initial thickness;

d) deforming the first layer so as to give it a second thickness which is less than the initial thickness and depositing the first layer thus deformed on the electrically conductive contact pads;

e) flipping the at least one electronic integrated circuit chip and causing the protruding elements to extend into the openings of the insulating layer to make contact with the first layer of the first shape memory material;

f) fastening a cover on the first face of the support substrate; and g) heating the structure obtained in step f) to a temperature which is higher than a temperature of end of transition to an austenitic state of the first shape memory material so that the first layer expands in thickness to apply a pressure against on the electrically conductive protruding elements.

20. The method according to claim 19, wherein the first shape memory material contains a nickel-titanium alloy.

21. The method according to claim 19, further comprising:

providing a second layer of a second shape memory material in a martensitic state and having an initial thickness;

deforming the second layer so as to give it a second thickness which is less than the initial thickness and depositing the second layer thus deformed on a second face of the at least one electronic integrated circuit chip which is opposite to the first face;

wherein step f) fastens the cover over the second layer, leaving a space between the second layer and the cover; and wherein the temperature of the heating in step g) is higher than a temperature of end of transition to an austenitic state of the second shape memory material so that the second layer expands in thickness to fill said space by ensuring a pressure on the cover.

* * * * *